(12) United States Patent
Cheng et al.

(10) Patent No.: US 9,496,318 B2
(45) Date of Patent: Nov. 15, 2016

(54) ELECTROLUMINESCENT DEVICE INCLUDING BOSS LAYER AND ITS MANUFACTURE METHOD

(71) Applicant: BOE TECHNOLOGY GROUP CO., LTD., Beijing (CN)

(72) Inventors: Hongfei Cheng, Beijing (CN); Yuxin Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/429,844

(22) PCT Filed: Jul. 18, 2014

(86) PCT No.: PCT/CN2014/082562
§ 371 (c)(1),
(2) Date: Mar. 20, 2015

(87) PCT Pub. No.: WO2015/039493
PCT Pub. Date: Mar. 26, 2015

(65) Prior Publication Data
US 2016/0020259 A1    Jan. 21, 2016

(30) Foreign Application Priority Data

Sep. 23, 2013    (CN) .......................... 2013 1 0436163

(51) Int. Cl.
*H01L 29/08*    (2006.01)
*H01L 27/32*    (2006.01)
*H01L 51/00*    (2006.01)

(52) U.S. Cl.
CPC ........... *H01L 27/322* (2013.01); *H01L 27/326* (2013.01); *H01L 27/3272* (2013.01);
(Continued)

(58) Field of Classification Search
CPC ................ H01L 27/322; H01L 27/326; H01L 27/3272; H01L 27/3276; H01L 51/0024
(Continued)

(56) References Cited

U.S. PATENT DOCUMENTS 7,786,669 B2    8/2010    Park
8,395,569 B2    3/2013    Min et al.
(Continued)

FOREIGN PATENT DOCUMENTS

CN    101728374 A    6/2010
CN    101728379 A    6/2010
(Continued)

OTHER PUBLICATIONS

First Chinese Office Action of Chinese Application No. 201310436163A, mailed May 22, 2015 with English translation.
(Continued)

*Primary Examiner* — Matthew Gordon
(74) *Attorney, Agent, or Firm* — Collard & Roe, P.C.

(57) ABSTRACT

An electroluminescent device and its manufacture method are disclosed. The electroluminescent device comprises a color film substrate (20) comprising a substrate (21) and a color filter layer, a boss layer (27), a first electrode (24), an organic electroluminescence layer (25) and a second electrode (26) disposed on the substrate (21); said color filter layer comprises a black matrix (221) and color blocks (222) separated by the black matrix (221); said boss layer (27) is disposed between said color filter layer and said first electrode (24), and the boss layer located above the color blocks (222) protrudes towards the side away from the substrate (21) to form a boss (271); said first electrode (24), said organic electroluminescence layer (25) and said second electrode (26) are disposed on the boss layer (27) orderly, (Continued)

and the second electrode (26) is located above said boss (271). In this electroluminescent device, the reliability of the electrical connection between the thin film transistors and the second electrode can be assured, and the etching difficulty during the manufacture process can be reduced, thereby improving the production efficiency.

19 Claims, 3 Drawing Sheets

(52) U.S. Cl.
CPC ....... *H01L 27/3276* (2013.01); *H01L 51/0024* (2013.01); *H01L 2227/323* (2013.01)

(58) Field of Classification Search
USPC .......................................................... 257/40
See application file for complete search history.

(56) References Cited

U.S. PATENT DOCUMENTS

| | | | |
|---|---|---|---|
| 8,604,687 | B2 | 12/2013 | Wang et al. |
| 8,970,520 | B2 | 3/2015 | Teraguchi et al. |
| 2005/0139839 | A1* | 6/2005 | Park .................... H01L 27/322 257/79 |
| 2007/0132374 | A1 | 6/2007 | Park |
| 2010/0096655 | A1 | 4/2010 | Lee et al. |
| 2012/0249454 | A1* | 10/2012 | Teraguchi ............ G06F 3/0412 345/173 |

FOREIGN PATENT DOCUMENTS

| | | |
|---|---|---|
| CN | 102738199 A | 10/2012 |
| CN | 202600318 U | 12/2012 |
| CN | 103474582 A | 12/2013 |
| CN | 203456463 U | 2/2014 |

OTHER PUBLICATIONS

Second Chinese Office Action of Chinese Application No. 201310436163.X, mailed Oct. 21, 2015 with English translation.
International Search Report with Notice of Transmittal of the International Search Report of PCT/CN2014/082562 in Chinese, mailed Oct. 24, 2014.
Written Opinion of the International Searching Authority of PCT/CN2014/082562 in Chinese with English translation mailed Oct. 24, 2014.

\* cited by examiner

ELECTROLUMINESCENT DEVICE INCLUDING BOSS LAYER AND ITS MANUFACTURE METHOD

CROSS REFERENCE TO RELATED APPLICATIONS

This application is the National Stage of PCT/CN2014/082562 filed on Jul. 18, 2014, which claims priority under 35 U.S.C. §119 of Chinese Application No. 201310436163.X filed on Sep. 23, 2013, the disclosure of which is incorporated by reference.

TECHNICAL FIELD

Embodiments of the present invention relate to an electroluminescent device and its manufacture method.

BACKGROUND

Organic light emitting diode (OLED), also called organic electroluminescence display (OELD), has been widely applied to mobile communication terminal, personal digital assistant (PDA) and palmtop computer for their various excellent properties such as self-luminescence, backlight needlessness, high contrast, thinness, broad visual angle, fast response, broad applicable temperature range, simple structure and simple manufacture process and so on.

OLED devices can be sorted into two categories: passive matrix OLED and active matrix OLED. In the case of active matrix OLED, the electric current through every OLED is controlled by the thin film transistor (TFT) circuit. Active matrix OLED possesses properties such as high luminescent efficiency and good image display effect.

As shown in FIG. 1, an active matrix OLED display device comprises a color film substrate 20 and an array substrate 10 opposite to each other. The color film substrate 20 comprises: substrate 21, and a color filter layer, a flat layer 23, a first electrode 24, an organic electroluminescence layer 25 and a second electrode 26 disposed on the substrate 21 orderly. The color filter layer comprises a black matrix 221 and color blocks 222 separated by the black matrix 221. The array substrate 10 comprises: a second substrate 11 and an array of thin film transistors 12, a protection layer 13 and a connection electrode 14 disposed on the substrate 11 orderly. The connection electrode 14 connects the drain of the thin film transistor 12 through the VIA of the protection layer. A frame sealing glue 30 is applied at the edge of the color film substrate 20 or the array substrate 10. The color film substrate 20 and the array substrate 10 have been connected oppositely, and the second electrode 26 and the connection electrode 14 on the array substrate 10 have been contacted correspondingly to achieve electrical connection.

SUMMARY

At least one embodiment of the present invention provides an electroluminescent device and its manufacture method, in which the reliability of the electrical connection between the thin film transistor and the second electrode can be assured, and at the same time, the production efficiency can be improved by reducing the etching difficulty and the film forming time during the manufacture process of the connection electrode.

At least one embodiment of the present invention provides an electroluminescent device comprising a color film substrate; said color film substrate comprises: a substrate and a color filter layer, a boss layer, a first electrode, an organic electroluminescence layer and a second electrode disposed on the substrate; said color filter layer comprises a black matrix and color blocks separated by the black matrix; said boss layer is disposed between said color filter layer and said first electrode; the boss layer located above said color blocks protrudes towards the side away from the substrate to form a boss; said first electrode, said organic electroluminescence layer and said second electrode are disposed on said boss layer orderly, and said second electrode is located above said boss.

At least one embodiment of the present invention further provides a manufacture method of an electroluminescent device, comprising: manufacturing a color film substrate, which comprises forming on a substrate a color filter layer which comprises a black matrix and color blocks separated by the black matrix; forming a boss layer on the substrate on which the color filter layer has been fainted, and forming a boss above the color blocks through a composition process; and forming a first electrode, an organic electroluminescence layer and a second electrode on the boss layer orderly, wherein the second electrode is located above the boss.

BRIEF DESCRIPTION OF THE DRAWINGS

In order to more clearly explain the embodiments of the present invention, some drawings related to the embodiments of the invention will be briefly described. Apparently, the drawings described below merely involve some embodiments of the present invention, and should not be understood as limitations on the present invention.

REFERENCE SIGNS

10—array substrate, 11—second substrate, 12—thin film transistor, 13—protection layer, 14—connection electrode, 20—color film substrate, 21—substrate, 221—black matrix, 222—color blocks, 23—flat layer, 24—first electrode, 25—organic electroluminescence layer, 26—second electrode, 27—boss layer, 271—boss, 30—frame sealing glue, 40—mask plate.

DETAILED DESCRIPTION

In order to make the aim, the technical details and the advantages of the embodiments of the invention apparent, the technical solutions of the embodiments will be described in a clearly and fully understandable way in connection with the drawings related to the embodiments of the invention. Apparently, the described embodiments are just part of but not all of the embodiments of the invention. Based on the described embodiments herein, those skilled in the art can obtain other embodiments without any inventive work, which should be within the scope of the invention.

Figure 1:
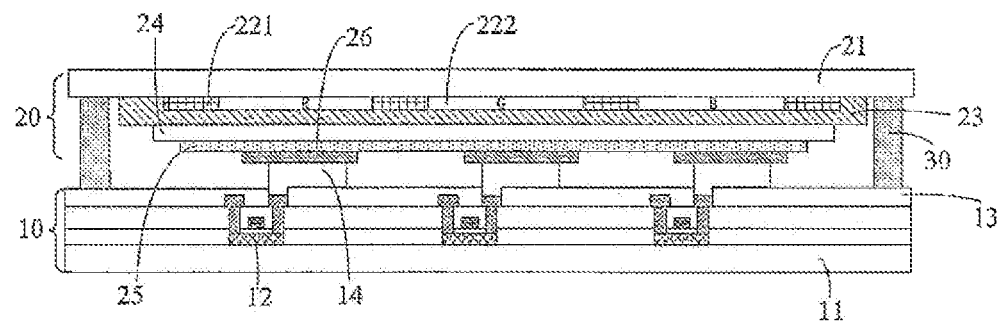
FIG. 1 is a structurally schematic diagram of an active matrix OLED display device.

In the structure shown in FIG. 1, the connection electrode 14 is generally manufactured relatively thick (from 2- to 3 μm) so as to fully contact the connection electrode 14 and the second electrode 26 after cell-assembling and improve the reliability of the electrical connection of the thin film transistor 12 and the second electrode 26. However, when the connection electrode 14 is manufactured, it takes a long time to form the thin film and it is difficult to etch the thin film.

Figure 2:
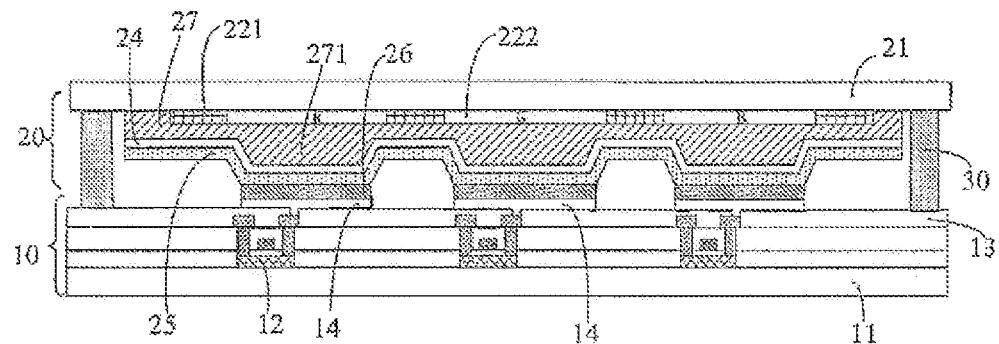
FIG. 2 is a structurally schematic diagram 1 of an electroluminescent display device provided by one embodiment of the present invention.

At least one embodiment of the present invention provides an electroluminescent device, as shown in FIG. 2, which comprises a color film substrate 20. The color film substrate 20 comprises: a substrate 21, and a color filter layer, a first electrode 24, an organic electroluminescence layer 25 and a second electrode 26 disposed on the substrate 21. The color filter layer comprises: a black matrix 221 (BM) and color blocks 222 (for example the red, green and blue R/G/B in the figure) separated by the black matrix 221. The color film substrate 20 further comprises a boss layer 27; the boss layer 27 is disposed between the color filter layer and the first electrode 24; the boss layer 27 located above the color blocks (R/G/B) 222, protrudes towards the side away from the substrate 21 to form a boss 271. The first electrode 24, the organic electroluminescence layer 25 and the second electrode 26 are disposed on the boss layer 27 orderly, and the second electrode 26 is located above the boss 271.

An active matrix electroluminescent device comprises a color film substrate 20 and an array substrate 10, and the color film substrate 20 is provided with a color filter layer and a luminescent OLED device. The luminescent OLED device comprises a first electrode 24, an organic electroluminescence layer 25 and a second electrode 26. The array substrate 10 is provided with TFT circuits (driving circuits) for driving and compensating the OLED. There are many ways to realize the driving circuits, however, the driving circuits should at least comprise a thin film transistor for driving. The thin film transistor 12 in at least one embodiment of the invention refers to a thin film transistor in driving circuits for driving. The drain of the thin film transistors 12 is introduced by the connection electrode 14. Through abutment of the second electrode 26 of the OLED and the connection electrode 14 on the array substrate 10 after combination of the color film substrate 20 with the array substrate 10, the electrical connection between the thin film transistor and the luminescent device is realized, and the electrical connection between the driving circuits and the luminescent device is realized.

At least one embodiment of the present invention raises up the second electrode 26 by adding the boss layer 27 with a boss, thus further reduces the thickness of the connection electrode 14 on the array substrate (e. g. the thickness can be reduced to from 0.3 to 1 micrometer). As a result, the film forming time in the manufacture process of the connection electrode 14 is reduced, and the difficulty of the etching is reduced, thereby improving the production efficiency. At the same time, through elevation of the second electrode 26, the reliability of the electrical connection between the thin film transistors and the second electrode 26 can be assured, and the damages caused by the crash and friction between the color film substrate and the array substrate during and after the cell-assembling process can be avoided, thereby improving the qualification yield.

It should be explained that, the realization mode of the driving circuit has no direct relation with the present invention, and dose not affect the implementation effects of the embodiments of the present invention, either. Therefore, the realization mode of the driving circuit is not limited in the embodiments of the present invention, and it can be any realization mode known by a person skilled in the art.

In at least one embodiment of the present invention, an electrode for docking with the connection electrode 14 can be further provided. For example, a protection layer is placed on the second electrode 26, and the second electrode 26 is introduced through the VIA provided in the protection layer to connect with the docking electrode. In this case, the second electrode in the present embodiment can further comprise a docking electrode connected to it.

The boss layer 27 can be manufactured from one of the following materials, or can be a composite film manufactured from a plurality of the following materials: silicon nitride, silicon oxide or photosensitive resin. Said photosensitive resin can be made of polyacrylic acid resin class, polyimide resin class or polyamide resin class. Refer to FIG. 5(*c*), for example, the total thickness d2 of the obtained boss layer 27 is from 2 to 4 micrometers. The boss 271 is formed at the position of the boss layer 27 corresponding to the color blocks 222 (red/green/blue, i.e., R/G/B in the figure) through composition processes such as coating, exposure, developing and etching. The shoulder height d1 of the boss 271 is for example from 1.5 to 2.5 micrometers. In another embodiment, if the boss layer 27 is made of photosensitive resin, only the exposure and developing processes are needed to form the boss 271.

In at least one embodiment of the present invention, said color film substrate 20 may further comprise a flat layer 23, which is disposed between the color filter film and the boss layer 27.

Figure 3A:
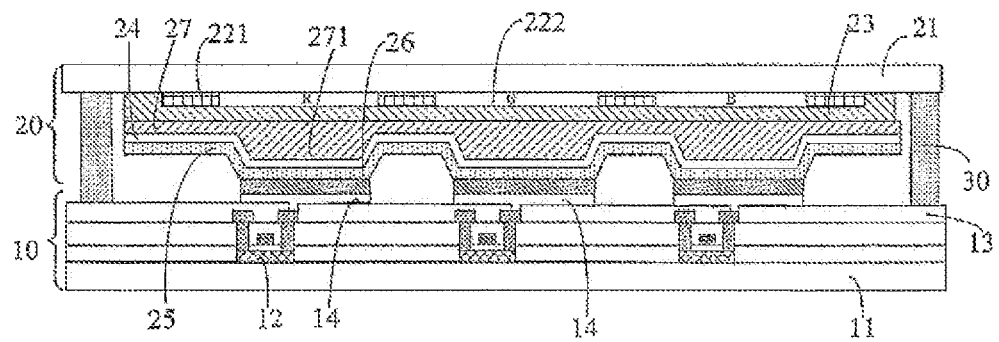
FIG. 3(a) is a structurally schematic diagram 2 of an electroluminescent display device provided by another embodiment of the present invention.
Figure 3B:
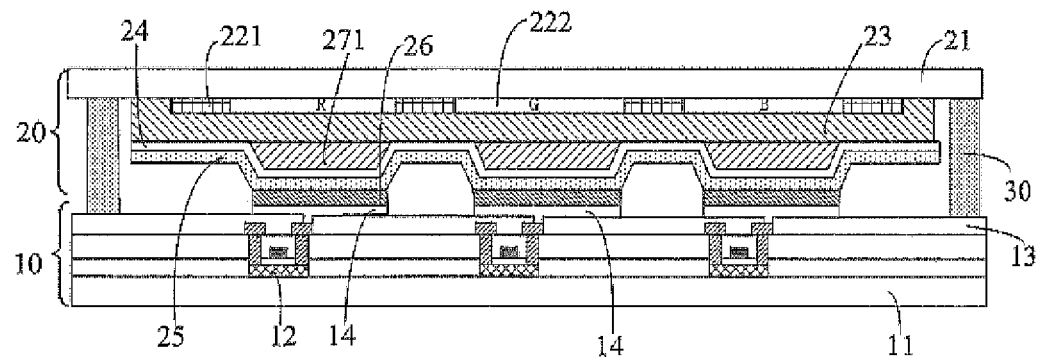
FIG. 3(b) is a structurally schematic diagram 3 of an electroluminescent display device provided by yet another embodiment of the present invention.

In at least one embodiment of the present invention, as shown in FIG. 3(*a*), after a flat layer 23 is manufactured on a color filter layer, a boss layer 27 may be formed on the flat layer 23, and the boss layer 27 is provided with a boss 271. In addition, as shown in FIG. 3(*b*), after a flat layer 23 is manufactured on a color filter layer, a boss 271 may be formed on the flat layer 23, the flat layer 23 together with the boss 271 constitutes a boss layer 27 of the present embodiment.

In at least one embodiment of the present invention, the array substrate 10 may comprise: a second substrate 11, and thin film transistors 12, a protection layer 13 and a connection electrode 14 disposed on the second substrate 11 orderly; a VIA is arranged in the protection layer 13; the connection electrode 14 is placed at a position corresponding to the second electrode 26 of the color film substrate 20, and the connection electrode 14 connects the drain of the thin film transistors 12 through the VIA of the protection layer.

The thickness of the connection electrode 14 is for example from 0.3 to 1 micrometer. Compared with for example the connection electrode in FIG. 1 with a thickness from 2 to 3 micrometers, the thickness of the connection electrode 14 has been significantly reduced, and thus the time of depositing the connection electrode has been saved.

As a result, the production efficiency can be improved by reducing the etching difficulty and simplifying the process in the following etching step.

Said connection electrode 14 may be made from one or several materials selected from: copper, molybdenum, tin, aluminum and silver. Said protection layer 13 may be made from one or several materials selected from: silicon nitride, silicon oxide or photosensitive resin.

At least one embodiment of the present invention provides an electroluminescent device, in which the thickness of the connection electrode can be further reduced, thereby improving the production efficiency due to reducing the etching difficulty and the film forming time during the manufacture process of the connection electrode; at the same time, by elevating the connection electrode, the reliability of the electrical connection between the thin film transistor and the second electrode can be assured, and the damages caused by the crash and friction between the color film substrate and the array substrate during and after the cell-assembling process can be avoided, thereby improving the qualification yield.

The electroluminescent device provided by at least one embodiment of the present invention may be: any products or components with display function such as electronic paper, mobile phones, Flat PC, televisions, monitors, laptop computer, digital frames or navigators.

Figure 4:
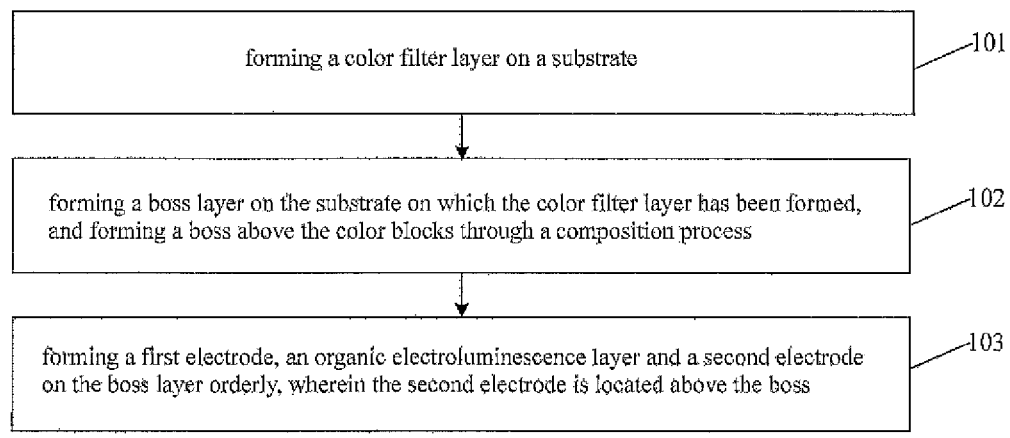
FIG. 4 is a flow chat of manufacturing a color film substrate in the manufacture method of an electroluminescent display device provided by one embodiment of the present invention.
Figure 5A:
FIG. 5(a) is a structurally schematic diagram of a substrate set with a color filter layer in one embodiment of the present invention.
Figure 5B:
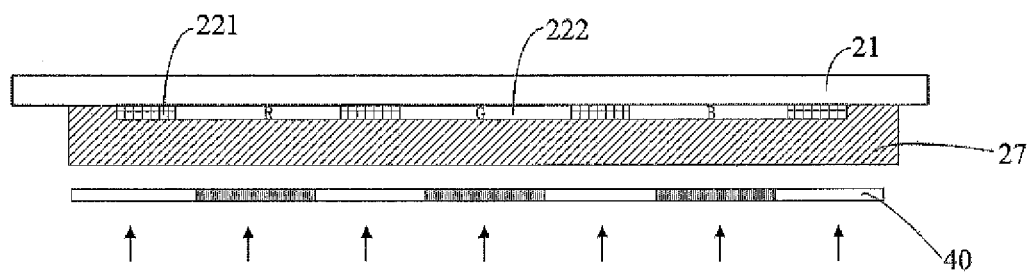
FIG. 5(b) is a schematic diagram of exposure of a boss layer in one embodiment of the present invention.
Figure 5C:
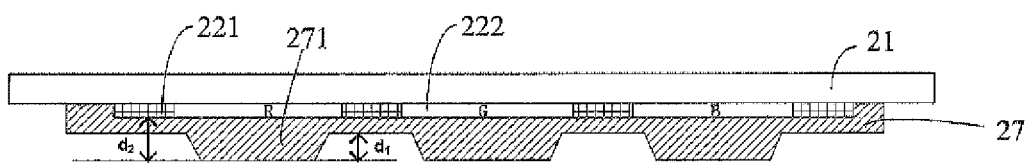
FIG. 5(c) is a structurally schematic diagram of a boss layer after a composition process in one embodiment of the present invention.

At least one embodiment of the present invention provides a manufacture method of electroluminescent device, which comprises: manufacturing the color film substrate, manufacturing the array substrate, and cell-assembling of the color film substrate and the array substrate. In one embodiment, as shown in FIG. 4, manufacturing the color film substrate may include the following steps:

Step 101: forming a color filter layer on the substrate 21, as shown in FIG. 5(a), said color filter layer comprises: black matrix 221 and color blocks 222 (for example the R/G/B color blocks in the figure) separated by the black matrix 221;

Step 102: as shown in FIG. 5(c), forming a boss layer 27 on the substrate 21 having the color filter layer, and forming a boss 271 above the color blocks 222 through a composition process.

Figure 5D:
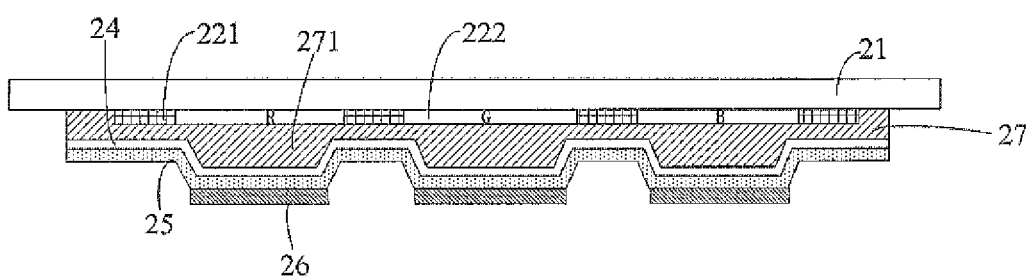
FIG. 5(d) is a structurally schematic diagram of a color film substrate in one embodiment of the present invention.

Step 103: as shown in FIG. 5(d), forming a first electrode 24, an organic electroluminescence layer 25 and a second electrode 26 on the boss layer 27 sequentially, wherein the second electrode 26 is located above the boss 271;

Forming the color filter layer in step 101, and forming the first electrode 24, the organic electroluminescence layer 25 and the second electrode 26 in step 103 will not be detailed herein for this embodiment again.

The boss layer 27 with the boss is formed in step 102. If the boss layer 27 is made from photosensitive resin, it may be realized for example by the following method: applying photosensitive resin to form the boss layer 27; as shown in FIG. 5(b), controlling the exposure using a mask, and forming the boss 271 of the boss layer 27 on the color blocks 222 after the exposure and developing (the color blocks R/G/B as shown in the figure), as shown in FIG. 5(c).

If non-photosensitive materials such as silicon nitride or silicon oxide are used, in order to from the boss 271 on the boss layer 27, several composition processes such as coating, exposure, developing and etching are required.

In addition, if the flatness of the color filter layer is not sufficient, the quality of the films produced in the succeeding steps will be harmed. Therefore, a flat layer may be manufactured on the color filter layer using silicon nitride or silicon oxide. In at least one embodiment of the present invention, the flat layer can be omitted if the boss layer 27 is arranged on the color filter layer. The flatness of the color filter substrate, especially the flatness of the pixel area having significant influence on the display quality, can be leveled by the boss layer 27 so as to satisfy the design requirements.

Of course, the flat layer may not be omitted in at least one embodiment of the present invention. For example: after the color filter layer being formed (step 101), and before step 102, the above method may further comprise: forming a flat layer 23 on the substrate with the color filter layer (refer to FIG. 3(a) and FIG. 3(b)). Then, step 102 may be carried out, forming the boss 271 on the flat layer 23. The other steps are the same as above.

The contents described above are related to manufacturing the color film substrate. Manufacturing the array substrate in at least one embodiment of the present invention may employ any processes known in the art. The position of the connection electrode 14 on the array substrate 10 is correlated with the boss 271 of the color film substrate 20, and the thickness of the connection electrode 14 is reduced (the thickness of the connection electrode 14 may be from 0.3 to 1 micrometer), and in the succeeding cell-assembling process of the color film substrate and the array substrate, the second electrode 26 arranged on the boss 271 contacts the thin film connection electrode 14 to realize electrical connection.

To sum up, in the manufacture method of the electroluminescent device according to the present embodiment, by adding a boss below the second electrode 26, the second electrode 26 can be elevated and the thickness of the connection electrode 14 can be reduced. Therefore, the production efficiency can be improved by reducing the etching difficulty and the film forming time during the manufacture process of the connection electrode 14; at the same time, by elevating the second electrode 26, the reliability of the electrical connection between the thin film transistor 22 and the second electrode 26 can be assured, and the damages caused by the crash and friction between the color film substrate 20 and the array substrate 10 during and after the cell-assembling process can be avoided, thereby improving the qualification yield.

It should be noted that, the technical features in the present embodiment can be used in any combination if there is no confliction.

The invention has been described with reference to some exemplary embodiments which are not limitative to the scope of the disclosure. The scope of the disclosure is defined by the accompanying claims.

The present application claims the benefits of the Chinese Application No. 201310436163.X filed on Sep. 23, 2013, the entire disclosure of which is incorporated herein by reference.

The invention claimed is:

1. An electroluminescent device comprising a color film substrate, wherein, the color film substrate comprises:
 a substrate, and
 a color filter layer, a boss layer, a first electrode, an organic electroluminescence layer and a second electrode disposed on the substrate, wherein the color filter layer comprises a black matrix and color blocks separated by the black matrix; said boss layer is disposed between the color filter layer and the first electrode, and the boss layer located above the color blocks protrudes towards the side away from the substrate to form a boss;

said first electrode, said organic electroluminescence layer and said second electrode are disposed on said boss layer orderly, and the second electrode is located above the boss, the device further comprises an array substrate, wherein, said array substrate comprises: a second substrate, and thin film transistors, a protection layer and a connection electrode disposed on the second substrate orderly;

a protection layer VIA is arranged in the protection layer, and the setting position of the connection electrode corresponds to the second electrode of the color film substrate, and the connection electrode connects the drain of the thin film transistors through the protection layer VIA.

2. The device according to claim 1, wherein, the total thickness of the boss layer is from 2 to 4 micrometers, and the shoulder height of the boss is from 1.5 to 2.5 micrometers.

3. The device according to claim 1, wherein, the boss layer is manufactured from one of the following materials, or can be a composite film manufactured from a plurality of the following materials: silicon nitride, silicon oxide or photosensitive resin.

4. The device according to claim 3, wherein, the photosensitive resin is polyacrylic acid resin class, polyimide resin class or polyamide resin class.

5. The device according to claim 1, wherein, the color film substrate further comprises a flat layer disposed between said color filter layer and said boss layer.

6. The device according to claim 1, wherein, the thickness of the connection electrode is from 0.3 to 1 micrometer.

7. The device according to claim 1, wherein, said connection electrode is made from one or several materials selected from: copper, molybdenum, tin, aluminum and silver.

8. The device according to claim 1, wherein, said protection layer is made from one or several materials selected from silicon nitride, silicon oxide or photosensitive resin.

9. A manufacture method of preparing an electroluminescent device, comprising a step of manufacturing a color film substrate, wherein, the manufacturing the color film substrate comprises:

forming on a substrate a color filter layer which comprises a black matrix and color blocks separated by the black matrix;

forming a boss layer on the substrate on which the color filter layer has been formed, and forming the boss above the color blocks; and forming a first electrode, an organic electroluminescence layer and a second electrode on the boss layer orderly, wherein the second electrode is located above the boss, the manufacture method of preparing the electroluminescent device further comprises a step of manufacturing an array substrate, wherein, the manufacturing the array substrate comprises disposing thin film transistors, a protection layer and a connection electrode on a second substrate orderly, wherein a protection layer VIA is arranged in the protection layer, and the setting position of the connection electrode corresponds to the second electrode of the color film substrate, and the connection electrode connects the drain of the thin film transistors through the protection layer VIA.

10. The manufacture method according to claim 9, wherein, if the boss layer is made from photosensitive resin, the boss is formed above the color blocks after exposure and developing of the boss layer.

11. The manufacture method according to claim 9, further comprising: forming a flat layer on the substrate with the color filter layer, and then forming the boss layer on the flat layer.

12. The device according to claim 2, wherein, the boss layer is manufactured from one of the following materials, or can be a composite film manufactured from a plurality of the following materials: silicon nitride, silicon oxide or photosensitive resin.

13. The device according to claim 12, wherein, the photosensitive resin is polyacrylic acid resin class, polyimide resin class or polyamide resin class.

14. The device according to claim 2, wherein, the color film substrate further comprises a flat layer disposed between said color filter layer and said boss layer.

15. The device according to claim 3, wherein, the color film substrate further comprises a flat layer disposed between said color filter layer and said boss layer.

16. The device according to claim 4, wherein, the color film substrate further comprises a flat layer disposed between said color filter layer and said boss layer.

17. The device according to claim 12, wherein, the color film substrate further comprises a flat layer disposed between said color filter layer and said boss layer.

18. The device according to claim 6, wherein, said connection electrode is made from one or several materials selected from: copper, molybdenum, tin, aluminum and silver.

19. The manufacture method according to claim 10, further comprising: forming a flat layer on the substrate with the color filter layer, and then forming the boss layer on the flat layer.

* * * * *